(12) United States Patent
Lai

(10) Patent No.: US 9,128,663 B1
(45) Date of Patent: Sep. 8, 2015

(54) TOUCH SENSING ELECTRODE STRUCTURE AND METHOD OF MANUFACTURING SAME

(71) Applicant: T-KINGDOM CO., LTD., Taoyuan County (TW)

(72) Inventor: Yu Hao Lai, Taoyuan (TW)

(73) Assignee: T-KINGDOM CO., LTD., Taoyuan County (TW)

(*) Notice: Subject to any disclaimer, the term of this patent is extended or adjusted under 35 U.S.C. 154(b) by 0 days.

(21) Appl. No.: 14/450,357

(22) Filed: Aug. 4, 2014

(51) Int. Cl.
*G06F 3/044* (2006.01)
*G06F 1/16* (2006.01)
*G06F 3/041* (2006.01)

(52) U.S. Cl.
CPC ........ *G06F 1/16* (2013.01); *G06F 3/041* (2013.01); *G06F 2203/04103* (2013.01); *G06F 2203/04107* (2013.01)

(58) Field of Classification Search
CPC .............. G06F 3/044; G06F 3/041; G06F 2203/04103; G06F 2203/04112; G06F 3/045; G06F 1/1643; G06F 1/1601; G06F 1/1626; G06F 2203/04111; G06F 1/16; H05K 1/0274; H05K 1/09; H05K 2201/0108; H05K 1/092
See application file for complete search history.

(56) References Cited

U.S. PATENT DOCUMENTS

2013/0258570 A1* 10/2013 Nashiki et al. ........... 361/679.01

* cited by examiner

*Primary Examiner* — Roy Potter
*Assistant Examiner* — Paul Patton
(74) *Attorney, Agent, or Firm* — Rabin & Berdo, P.C.

(57) ABSTRACT

A method of manufacturing touch sensing electrode structure includes the steps of selecting a predetermined substrate material to form a substrate layer; forming at least one adhesion layer on the substrate layer; forming a masking layer with recessed lines on the adhesion layer; forming metal conductive electrodes in the recessed lines on the masking layer; removing the masking layer for the metal conductive electrodes to present a circuit pattern and etching off portions of the adhesion layer located between the metal conductive electrodes; and forming at least one weatherproof layer on peripheral surfaces of the metal conductive electrodes. The touch sensing electrode structure manufactured according to the above method has high yield rate and is weatherproof, and the metal conductive electrodes thereof have precisely controlled small width.

22 Claims, 16 Drawing Sheets

Select a predetermined substrate material to form a substrate layer

Form at least one adhesion layer on the substrate layer

Form a masking layer with recessed lines on the adhesion layer

Form one or more metal conductive electrodes in the recessed lines on the masking layer, and then form a first weatherproof layer on a top surface of each of the metal conductive electrodes

Remove the masking layer for the metal conductive electrodes to present a circuit pattern, remove portions of the adhesion layer located between the metal conductive electrodes through an etching process, and form a second weatherproof layer on around peripheral surfaces of the metal conductive electrodes, outer surfaces of the first weatherproof layer and outer surfaces of the adhesion layer, so that the second weatherproof layer cooperates with the adhesion layer to seal and therefore isolate the metal conductive electrodes from an outer space

Provide an optically clear adhesive film to completely cover and seal the produced touch sensing electrode structure

FIG. 8A

Select a predetermined substrate material to form a substrate layer

Form at least one adhesion layer on the substrate layer

Form a masking layer with recessed lines on the adhesion layer

Form one or more metal conductive electrodes in the recessed lines on the masking layer, and then form a weatherproof layer on a top surface of each of the metal conductive electrodes Remove the masking layer for the metal conductive electrodes to present a circuit pattern, and remove portions of the adhesion layer located between the metal conductive electrodes through an etching process Provide an optically clear adhesive film to completely cover and seal the produced touch sensing electrode structure

FIG. 10A

TOUCH SENSING ELECTRODE STRUCTURE AND METHOD OF MANUFACTURING SAME

FIELD OF THE INVENTION

The present invention relates to a touch sensing electrode structure and a method of manufacturing same, and more particularly, to a touch sensing electrode structure manufacturing method, in which a masking layer is used in forming metal conductive electrodes for the touch sensing electrode structure and a weatherproof layer is formed to completely cover the metal conductive electrodes, so as to increase the yield rate of the touch sensing electrode structure and prolong the service life thereof.

BACKGROUND OF THE INVENTION

In response to the development of compact and light weight electronic information products, the semiconductor manufacturing process is now aimed to enable high-density and automated production. On the other hand, the currently available electronic information products are designed to have a touch sensing surface or touchscreen that is gradually increased in size. As a result, the conductive electrodes for the touchscreen originally made of an indium tin oxide (ITO) material are now replaced by metal conductive electrodes. To avoid the metal conductive electrodes formed on a substrate of the touchscreen from being visually perceived by a user, it is a target of the research and development engineers in the touchscreen industry to develop metal conductive electrodes having a very small width.

FIG. 1 is a pictorial description of a conventional method of manufacturing metal conductive electrodes 10. In a first step, a layer of material for forming metal conductive electrodes 10 is adhered to a substrate 12 via at least one adhesion layer 11, which is also referred to as a bonding layer, so that the metal conductive electrodes 10 formed later does not easily separate from the substrate 12. In a second step, at least one weatherproof layer 13, which is also referred as an anti-corrosion layer, is covered on the layer of material for forming metal conductive electrodes 10. In a third step, a wet etching process using an etching fluid is conducted, so that the weatherproof layer 13, the layer of material for forming metal conductive electrodes 10 and the adhesion layer 11 are etched to form an electrode circuit 14 consisting of a plurality of metal conductive electrodes 10. Finally, the entire surfaces of the electrode circuit 14 are covered with an optically clear adhesive (OCA) film 16.

Please refer to FIG. 2, the adhesion layer 11 formed according to the above conventional metal conductive electrode manufacturing method includes two sublayers, namely, an intermediate layer 17 connected to the substrate 12 and an electrically conductive seed layer 18 connected to the layer of material for forming metal conductive electrodes 10.

The wet etching is isotropic. Since the weatherproof layer 13 is formed of an etch-resistant material, there is a relatively large difference between the etching rates of the etching fluid on the weatherproof layer 13 and on the layer of material for forming metal conductive electrodes 10. Moreover, the weatherproof layer 13 formed in the second step usually has a non-uniform thickness. As a result, when the etching fluid vertically etches the weatherproof layer 13, the layer of material for forming metal conductive electrodes 10 and the adhesion layer 11, a serious side etching 15 will occur on the metal conductive electrodes 10 formed in the wet etching process.

In other words, when being viewed sidewardly as shown FIG. 1, the side etching 15 tends to occur on the lateral surfaces of the metal conductive electrodes 10 so formed, particularly when the metal conductive electrodes 10 have a designed width smaller than 5 μm and a designed thickness larger than 0.3 μm. As a result, the total etched surface on each of the metal conductive electrodes 10 is too large in proportion to the total area thereof, and the metal conductive electrodes 10 are unevenly etched to result in increased electric impedance of the electrode circuit 14. In some worse conditions, the electrode circuit 14 formed of the metal conductive electrodes 10 will break locally. Therefore, the metal conductive electrodes 10 are not easily controllable in quality and have low yield rate to form a tough problem in manufacturing very fine conductive electrodes.

Moreover, in view that the metal conductive electrodes 10 currently widely used to form the electrode circuit 14 all have a very small width, it is necessary to further provide the metal conductive electrodes 10 with some protection measure, so that the electrode circuit 14 is not easily oxidized after being used in the working environment over a long period of time and does not lose its intended operating performance, allowing the touchscreen produced with the metal conductive electrodes 10 to have prolonged service life, good yield rate and environmental durability.

In addition, all the manufactured touchscreens are subjected to a series of strict environmental durability tests. For example, the touchscreens are subjected to a high temperature of 85° C. and a 90% relative humidity for 1000 hours in a high-temperature heating test; and are boiled at 100° C. for 100 minutes to simulate the use of the touchscreens in a high-temperature and high-pressure environment for an extended time period.

During the above two tests, water molecules permeating through the optically clear adhesive film 16 to contact with the metal conductive electrodes 10 tend to cause oxidation of the metal conductive electrodes 10. Therefore, when the touchscreens using the metal conductive electrodes 10 manufactured with the conventional method have been used over a long time, their capacitive sensors might very possibly have a largely increased impedance value and could not operate in a normal state.

It is therefore tried by the inventor to overcome the drawbacks of the metal conductive electrodes 10 manufactured in the conventional method.

SUMMARY OF THE INVENTION

A primary object of the present invention is to provide a method of manufacturing touch sensing electrode structure, in which a masking layer with a predetermined circuit pattern is used to overcome the problem of low yield rate of metal conductive electrodes due to serious side etching thereof as found in the conventional method of manufacturing metal conductive electrodes.

Another object of the present invention is to provide a method of manufacturing touch sensing electrode structure, in which metal conductive electrodes so formed are covered by at least one weatherproof layer and accordingly protected against oxidation caused by moisture in the air, allowing the completed touch sensing electrode structure to have prolonged service life.

A further object of the present invention is to provide a method of manufacturing touch sensing electrode structure, in which a masking layer with a predetermined circuit pattern is used to precisely control the width of every metal conductive electrode formed with the method.

A still further object of the present invention is to provide a touch sensing electrode structure that effectively reduces the interference phenomenon of the moiré effect, allowing a touchscreen using the touch sensing electrode structure to have increased light transmittance, increased color saturation and reduced color cast and therefore more comfortable for viewing.

To achieve the above and other objects, the method of manufacturing touch sensing electrode structure according to the present invention includes the steps of (A) selecting a predetermined substrate material to from a substrate layer, which can be a flexible or a rigid substrate layer; (B) forming at least one adhesion layer on the substrate layer; (C) forming a masking layer with recessed lines on the adhesion layer; (D) forming one or more metal conductive electrodes in the recessed lines on the masking layer; (E) removing the masking layer for the metal conductive electrodes to present a circuit pattern, removing portions of the adhesion layer located between the metal conductive electrodes through an etching process, and forming at least one weatherproof layer on outer surfaces of the metal conductive electrodes.

According to a preferred embodiment of the present invention, in the step (E), the weatherproof layer is formed on around peripheral surfaces of each of the metal conductive electrodes, and the weatherproof layer cooperates with the adhesion layer to seal and isolate the metal conductive electrodes from an outer space. Further, the weatherproof layer is configured to have a blackening effect to shield the metal conductive electrodes from being seen by users.

In a preferred embodiment, the step (D) further includes a step of forming a first weatherproof layer on a top surface of each of the metal conductive electrodes.

In a preferred embodiment, the at least one weatherproof layer formed in the step (E) includes a second weatherproof layer formed on peripheral surfaces of each of the metal conductive electrodes.

In a preferred embodiment, the adhesion layer formed in the step (B) includes an intermediate layer formed on the substrate layer, an electrically conductive seed layer formed on the intermediate layer, and an anti-oxidation layer formed on the seed layer.

In another preferred embodiment, the adhesion layer formed in the step (B) includes a blackened layer formed on the substrate layer, an intermediate layer formed on the blackened layer, and an electrically conductive seed layer formed on the intermediate layer.

In a further preferred embodiment, the adhesion layer formed in the step (B) includes a blackened layer formed on the substrate layer, an intermediate layer formed on the blackened layer, an electrically conductive seed layer formed on the intermediate layer, and an anti-oxidation layer formed on the seed layer.

According to the method of the present invention, the adhesion layer is formed through vacuum sputtering, chemical deposition, polymer coating, or any combination thereof.

According to the method of the present invention, the masking layer is formed on the adhesion layer through a printing process, a photoresist exposure and development process, or any combination thereof.

According to the method of the present invention, the metal conductive electrodes are formed through vacuum sputtering, vapor deposition, chemical deposition, electroplating, electrically conductive polymer coating, or any combination thereof.

According to the method of the present invention, the weatherproof layer is formed through chemical deposition, electroplating, electrically conductive polymer coating, or any combination thereof.

To achieve the above and other objects, the touch sensing electrode structure provided according to the present invention includes a substrate layer, at least one adhesion layer forming a circuit pattern on the substrate layer, one or more metal conductive electrodes formed on the adhesion layer to form a conducting circuit corresponding to the circuit pattern, and a weatherproof layer covering peripheral surfaces of each of the metal conductive electrodes, so as to seal and isolate the conducting circuit from an outer space.

The weatherproof layer includes a first weatherproof layer formed on a top surface of each of the metal conductive electrodes and a second weatherproof layer formed on peripheral surfaces of each of the metal conductive electrodes and outer surfaces of the adhesion layer.

The adhesion layer can be implemented in three different structural manners.

In a first structural manner, the adhesion layer includes an intermediate layer formed on the substrate layer, an electrically conductive seed layer formed on the intermediate layer, and an anti-oxidation layer formed on the seed layer.

In a second structural manner, the adhesion layer includes a blackened layer formed on the substrate layer, an intermediate layer formed on the blackened layer, and an electrically conductive seed layer formed on the intermediate layer.

In a third structural manner, the adhesion layer includes a blackened layer formed on the substrate layer, an intermediate layer formed on the blackened layer, an electrically conductive seed layer formed on the intermediate layer, and an anti-oxidation layer formed on the seed layer.

According to a preferred embodiment of the present invention, the touch sensing electrode structure further includes an optically clear adhesive film covering entire outer surfaces of the substrate layer and the weatherproof layer. Further, the optically clear adhesive film can be formed of silicone or acrylic resin.

The conducting circuit formed of the metal conductive electrodes presents a grid-like structure, and the weatherproof layer presents an n-shaped sectional structure.

According to the present invention, the substrate layer of the touch sensing electrode structure can be formed of a soft material or a glass sheet. The soft material for forming the substrate layer can be polyethylene terephthalate (PET), poly (methyl methacrylate) (PMMA), polycarbonate (PC), poly (phenylene sulfone) (PPSU), polyethylenimine (PEI) or polyimide (PI).

According to the present invention, the adhesion layer of the touch sensing electrode structure can be formed of a metal material, a metal oxide material, a polymeric material, or any composite material thereof. The metal material for forming the adhesion layer can be tungsten (W), nickel (Ni), chromium (Cr), copper (Cu), vanadium (V), molybdenum (Mo), tin (Sn), zinc (Zn), cobalt (Co), iron (Fe), titanium (Ti), aluminum (Al) or niobium (Nb) or any alloy thereof; and the metal oxide material for forming the adhesion layer can be an oxide of tungsten, nickel, chromium, copper, vanadium, molybdenum, tin, zinc, cobalt, iron, titanium, aluminum, or niobium, or any alloy thereof.

According to the present invention, the metal conductive electrodes of the touch sensing electrode structure can be formed of a metal material, such as gold (Au), copper (Cu), silver (Ag), zinc (Zn), aluminum (Al), nickel (Ni) or tin (Sn), or any alloy thereof; or can be formed of an electrically conductive polymeric material.

According to the present invention, the weatherproof layer of the touch sensing electrode structure can be formed of carbon (C), graphite, a metal material, a metal oxide material, or an electrically conductive polymeric material, or any composite material thereof. The metal material for forming the weatherproof layer can be tungsten (W), nickel (Ni), chromium (Cr), copper (Cu), aluminum (Al), silver (Ag), titanium (Ti), molybdenum (Mo), tin (Sn), zinc (Zn), cobalt (Co), iron (Fe) or niobium (Nb), or any alloy thereof; and the metal oxide material for forming the weatherproof layer can be an oxide of tungsten, nickel, chromium, copper, aluminum, sliver, titanium, molybdenum, tin, zinc, cobalt, iron or niobium, or any alloy thereof.

According to the touch sensing electrode structure of the present invention, the adhesion layer has a thickness ranged between 0.01 μm and 1 μm; the metal conductive electrodes respectively have a thickness ranged between 0.1 μm and 6 μm; the weatherproof layer has a thickness ranged between 0.01 μm and 1 μm; and the metal conductive electrodes respectively have a width ranged between 0.1 μm and 10 μm.

The touch sensing electrode structure and the method of manufacturing same according to the present invention are characterized in that the use of the masking layer in the manufacturing process ensures stably controlled width of the metal conductive electrodes to largely increase the yield rate thereof, and that the metal conductive electrodes presenting the circuit pattern are completely covered and protected by the weatherproof layer to largely increase the service life of the touch sensing electrode structure.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIG. 8A is a flowchart showing the steps included in the method of manufacturing touch sensing electrode structure of the present invention according to a third preferred embodiment thereof.

FIG. 10A is a flowchart showing the steps included in the method of manufacturing touch sensing electrode structure of the present invention according to a fifth preferred embodiment thereof.

DETAILED DESCRIPTION OF THE PREFERRED EMBODIMENTS

Figure 1:
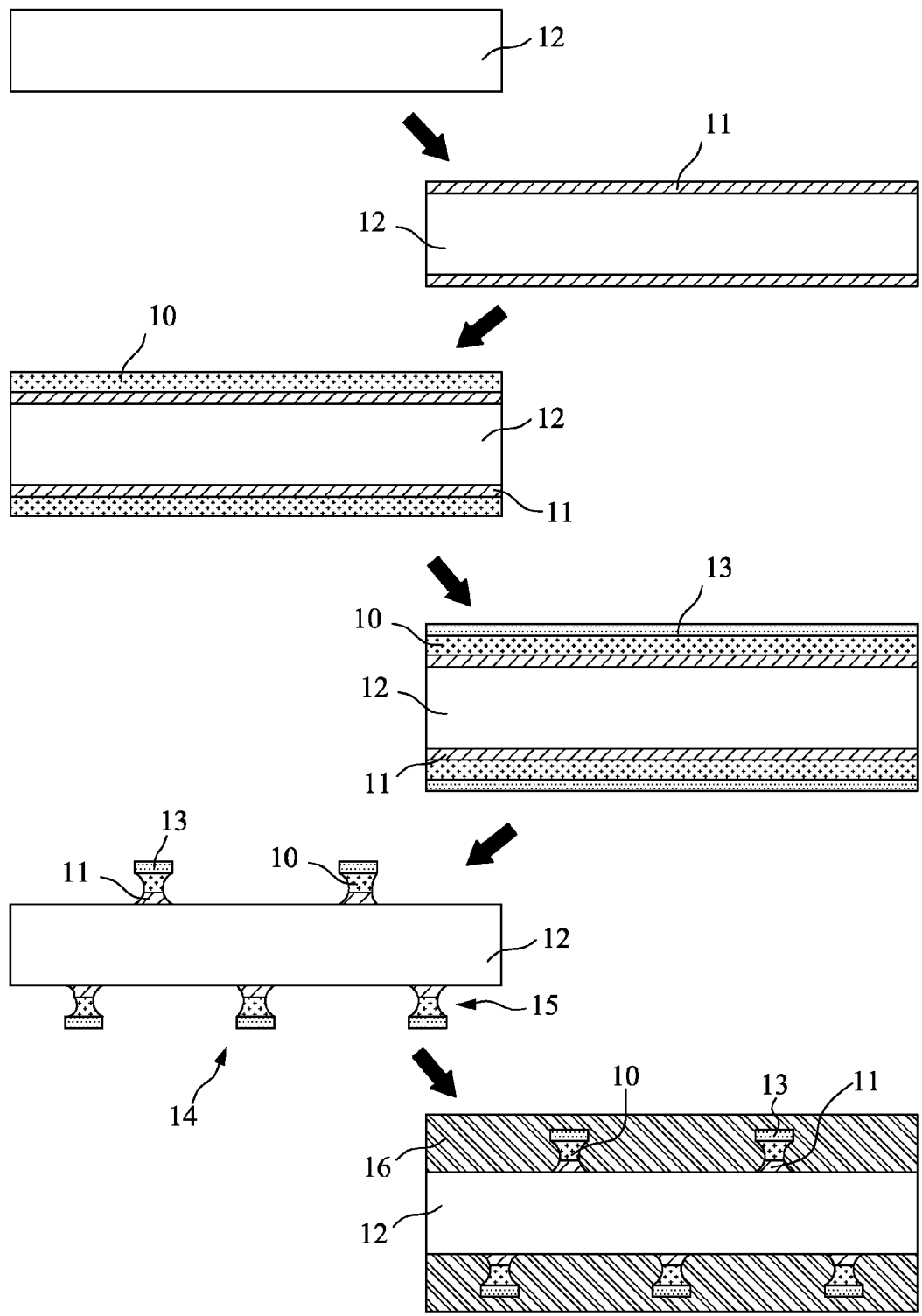
FIG. 1 is a pictorial description of the steps included in a conventional method of manufacturing metal conductive electrodes.

The present invention will now be described with some preferred embodiments thereof and by referring to the accompanying drawings. For the purpose of easy to understand, elements that are the same in the preferred embodiments are denoted by the same reference numerals.

Figure 3A:
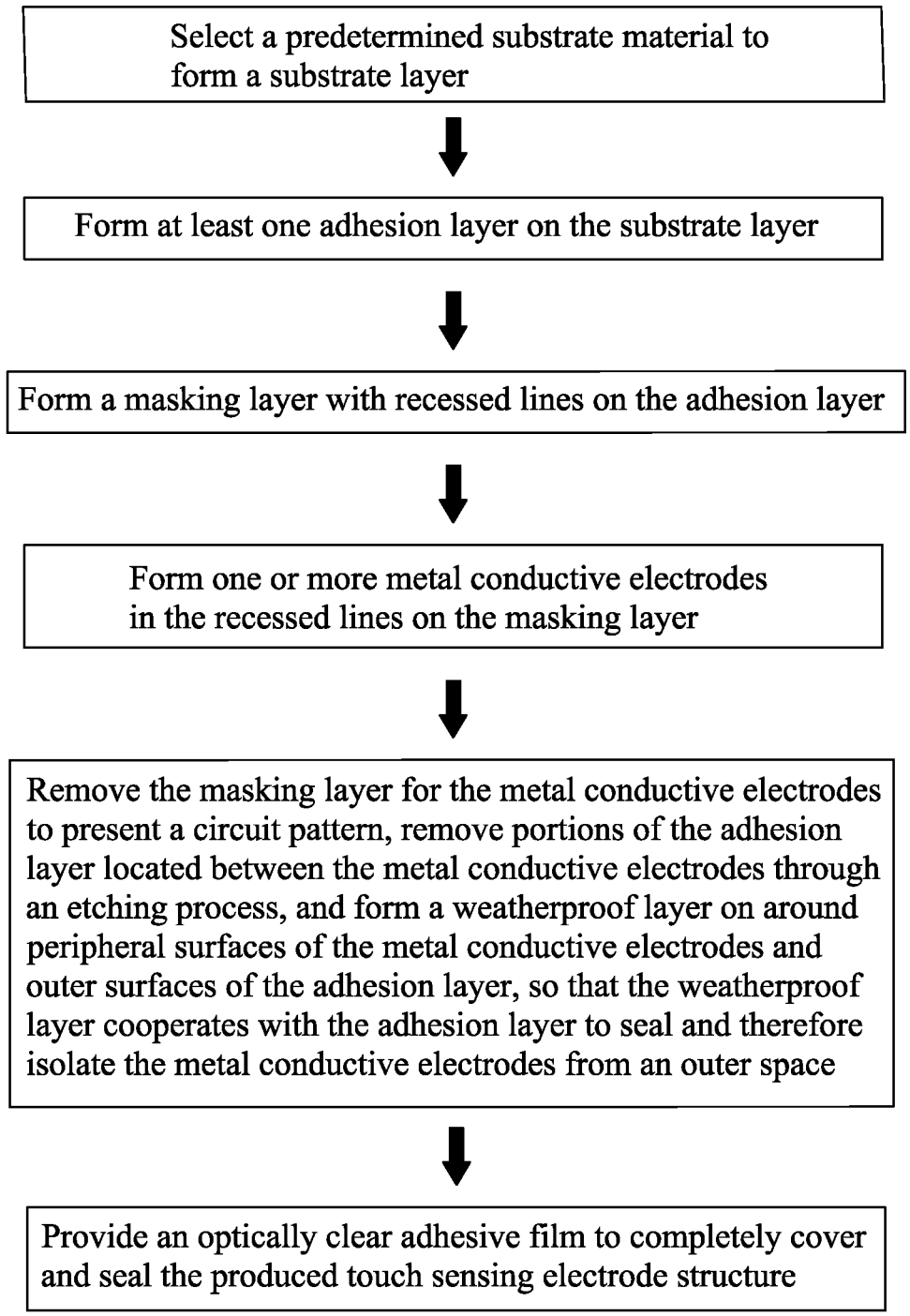
FIG. 3A is a flowchart showing the steps included in a method of manufacturing touch sensing electrode structure of the present invention according to a first preferred embodiment thereof.
Figure 3B:
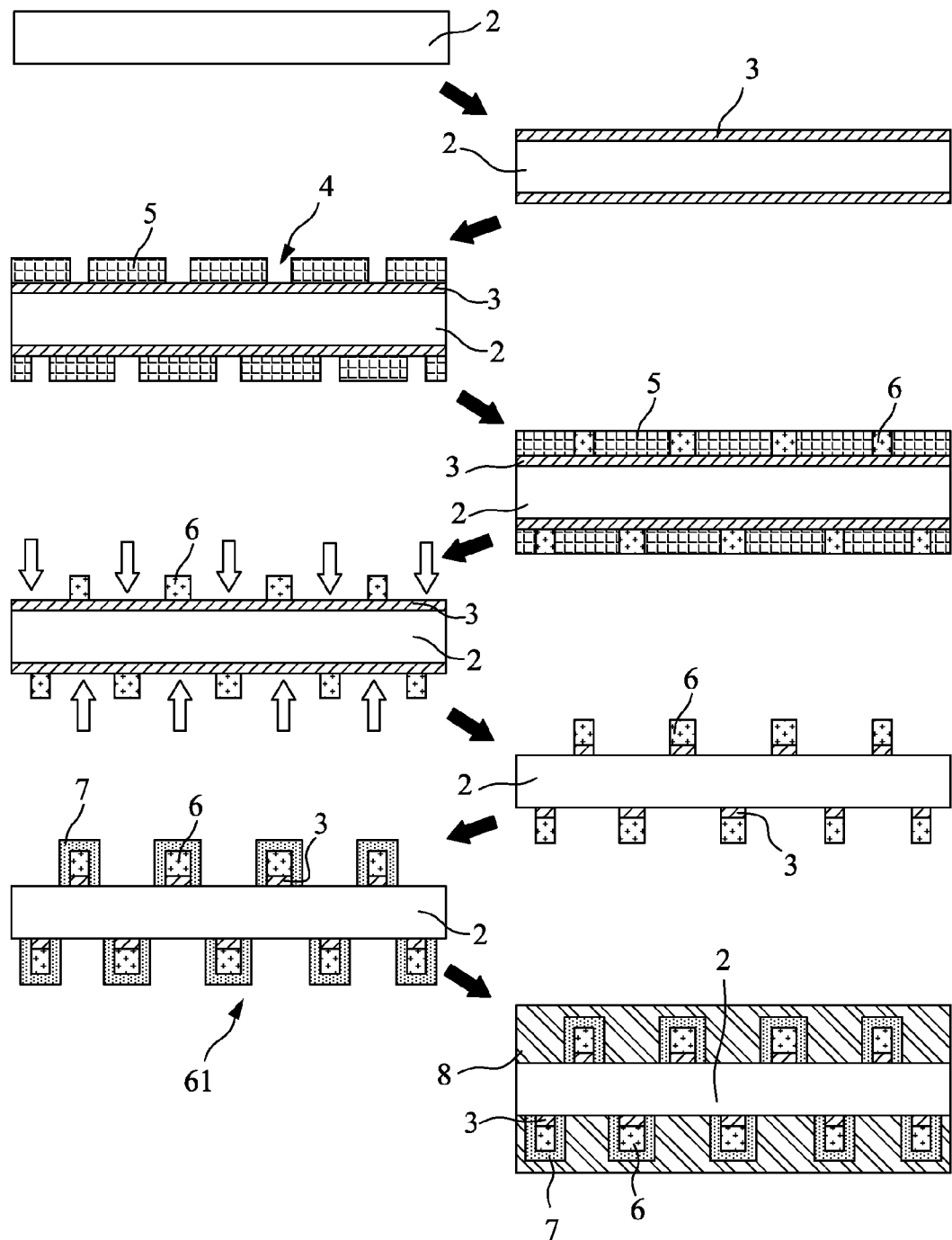
FIG. 3B is a pictorial description of the steps in the flowchart of FIG. 3A.

Please refer to FIG. 3A that is a flowchart showing the steps included in a first preferred embodiment of a method of manufacturing touch sensing electrode structure according to the present invention, and to FIG. 3B that is a pictorial description of the steps in the flowchart of FIG. 3A. The following is a detailed description of these steps, which are numbered from (A) to (F) herein for ease of reference.

Step (A): Select a predetermined substrate material and use the same to form a substrate layer 2. The substrate layer 2 can be formed of a soft material or a glass sheet. The soft material for forming the substrate layer 2 can be polyethylene terephthalate (PET), poly(methyl methacrylate) (PMMA), polycarbonate (PC), poly(phenylene sulfone) (PPSU), polyethylenimine (PEI) or polyimide (PI).

Step (B): Form at least one electrically conductive adhesion layer 3 on the substrate layer 2. The adhesion layer 3 can be formed through vacuum sputtering, chemical deposition, polymer coating, or any combination thereof. And, the adhesion layer 3 can be formed of a metal material, a metal oxide material, a polymeric material, or any composite material thereof. The metal material for forming the adhesion layer 3 can be tungsten (W), nickel (Ni), chromium (Cr), copper (Cu), vanadium (V), molybdenum (Mo), tin (Sn), zinc (Zn), cobalt (Co), iron (Fe), titanium (Ti), aluminum (Al), niobium (Nb), or any alloy thereof. The metal oxide material for forming the adhesion layer 3 can be an oxide of tungsten, nickel, chromium, copper, vanadium, molybdenum, tin, zinc, cobalt, iron, titanium, aluminum, niobium, or any alloy thereof.

Figure 2:
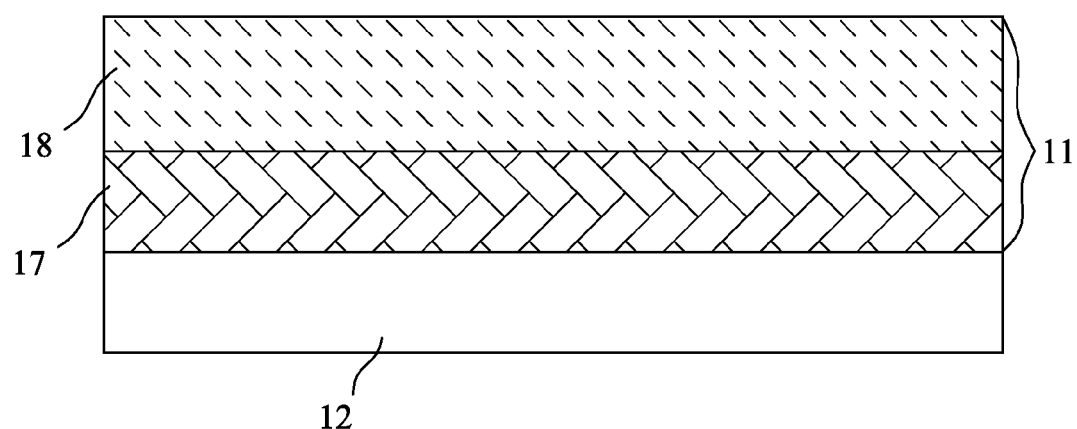
FIG. 2 is an enlarged sectional view of an adhesion layer for the conventional metal conductive electrodes made according to the method of FIG. 1.
Figure 4:
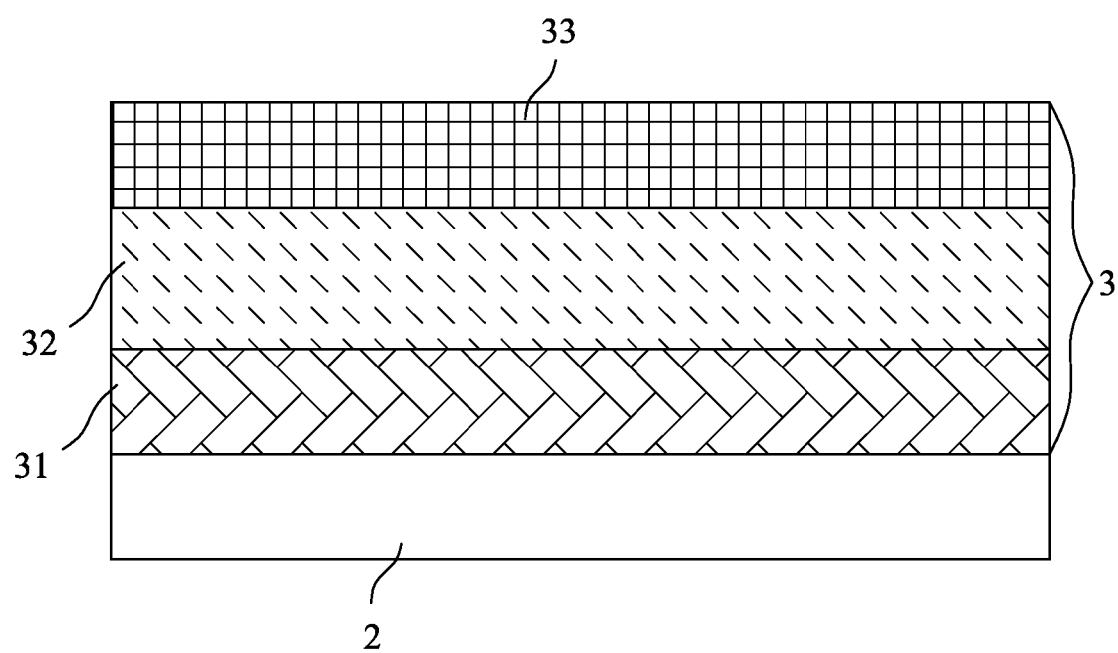
FIG. 4 is an enlarged sectional view of a first embodiment of an adhesion layer formed with the method of FIG. 3A.

Please refer to FIG. 4 that is a sectional view showing a first embodiment of the adhesion layer 3 formed according to the first preferred embodiment of the method of the present invention. Compared to the conventional adhesion layer 11 having two sublayers as shown in FIG. 2, the adhesion layer 3 according to the first embodiment thereof includes three sublayers sequentially deposited on the substrate layer 2 through the sputtering process, namely, an intermediate layer 31, an electrically conductive seed layer 32, and an anti-oxidation layer 33. More specifically, to form the adhesion layer 3, first deposit the intermediate layer 31 on the substrate layer 2, then deposit the seed layer 32 on the intermediate layer 31, and finally deposit the anti-oxidation layer 33 on the seed layer 32.

Figure 5:
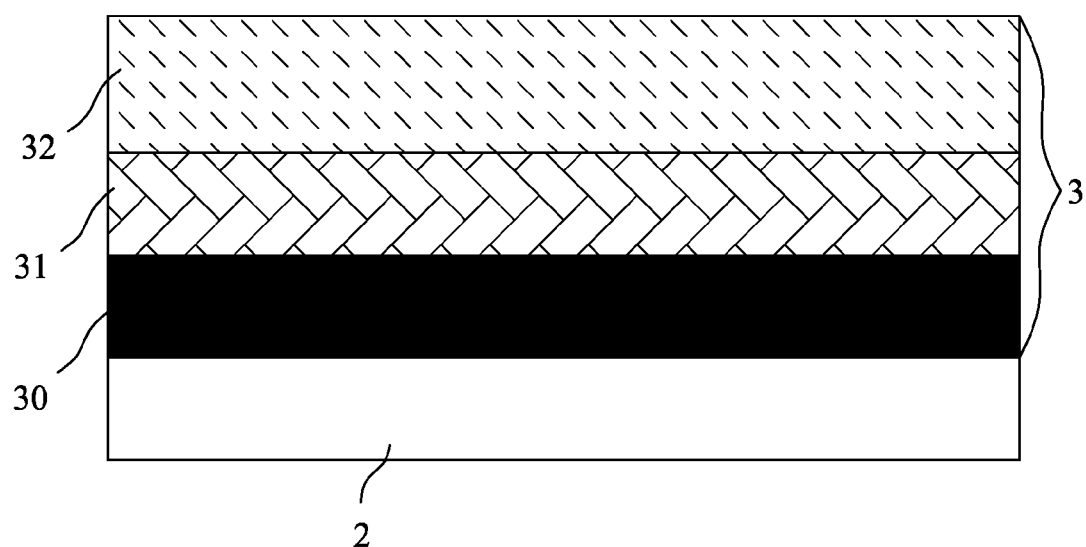
FIG. 5 is an enlarged sectional view of a second embodiment of the adhesion layer formed with the method of FIG. 3A.

FIG. 5 is a sectional view showing a second embodiment of the adhesion layer 3 formed according to the first preferred embodiment of the method of the present invention. The adhesion layer 3 according to the second embodiment thereof also includes three sublayers sequentially deposited on the substrate layer 2 through the sputtering process, namely, a blackened layer 30, an intermediate layer 31 and an electrically conductive seed layer 32. More specifically, to form the adhesion layer 3, first deposit the blackened layer 30 on the substrate layer 2, then deposit the intermediate layer 31 on the blackened layer 30, and finally deposit the seed layer 32 on the intermediate layer 31.

Figure 6:
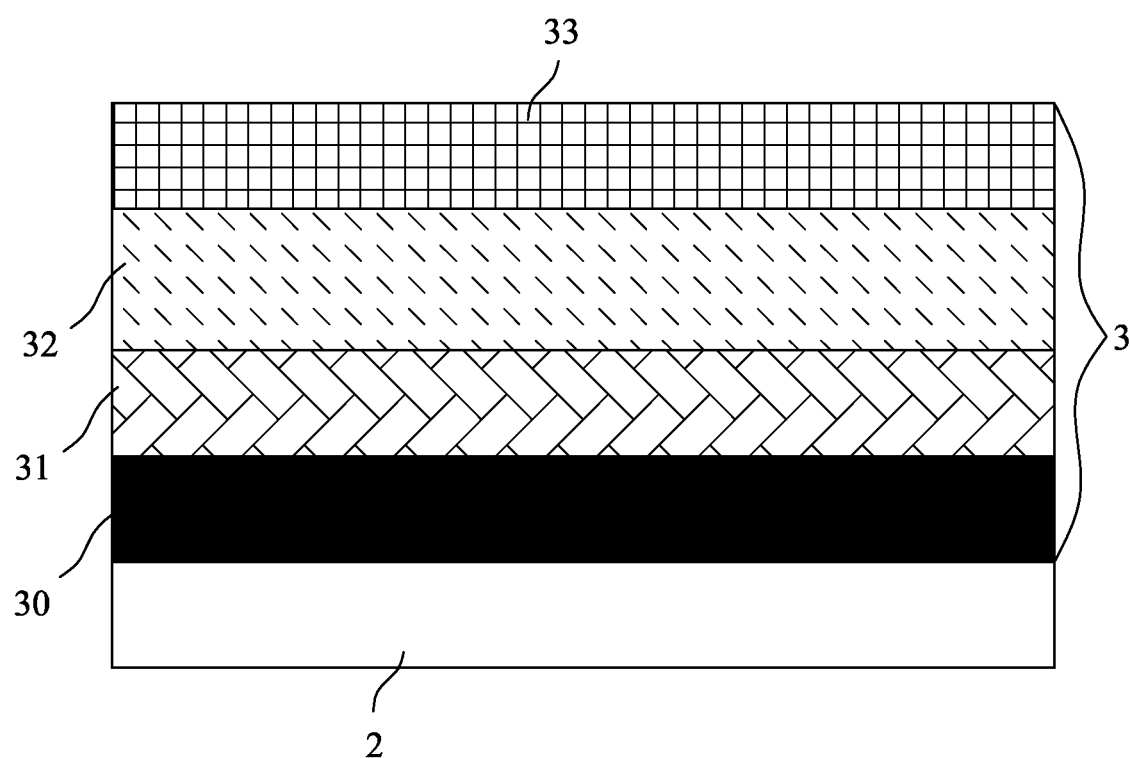
FIG. 6 is an enlarged sectional view of a third embodiment of the adhesion layer formed with the method of FIG. 3A.

FIG. 6 is a sectional view showing a third embodiment of the adhesion layer 3 formed according to the first preferred embodiment of the method of the present invention. The adhesion layer 3 according to the third embodiment thereof includes four sublayers sequentially deposited on the substrate layer 2 through the sputtering process, namely, a blackened layer 30, an intermediate layer 31, an electrically conductive seed layer 32, and an anti-oxidation layer 33. More specifically, to form the adhesion layer 3, first deposit the blackened layer 30 on the substrate layer 2, then deposit the intermediate layer 31 on the blackened layer 30 and deposit the seed layer 32 on the intermediate layer 31, and finally deposit the anti-oxidation layer 33 on the seed layer 32.

In the second and the third embodiment thereof, the adhesion layer 3 further includes a blackened layer 30 deposited on the substrate layer 2. The blackened layer 30 is formed of an electrically conductive metal oxide material or an anti-corrosion metal oxide material, and has a thickness ranged from 5 nm to 0.1 μm. In other words, the blackened layer 30 usually has a relatively dark color, such as dark blue, dark green, dark purple, dark brown or black, to facilitate absorption of light reflected or refracted from a product, i.e. a touchscreen. With the blackened layer 30, the metal conductive electrodes 6 formed on the adhesion layer 3 later are not easily visually perceived by a user who is using the touchscreen. The blackened layer 30 also effectively reduces the interference phenomenon of the moiré effect, making the touchscreen more comfortable for viewing.

The intermediate layer 31 is also referred to as a tie-coat layer, and functions to bond the blackened layer 30 to the seed layer 32 that is easily oxidized. Conventionally, there are three ways to avoid oxidation of the seed layer 32. In the first way, an acid solution is used to remove the oxidized seed layer 32. In the second way, the seed layer 32 is temporarily freeze-dried or stored at low temperature and low humidity and then must be used within 12 to 24 hours. In the third way, the seed layer 32 is stored under vacuum and then must be used within 3 to 6 months. In the present invention, however, an anti-oxidation layer 33 is deposited on the seed layer 32 to prevent the latter from oxidizing.

Please refer back to FIGS. 3A and 3B. Step (C): Form a masking layer 5 on the adhesion layer 3. The masking layer 5 can be formed of a photoresist which is subjected to an exposure and development process, or be formed of a polymeric material that is subjected to a printing process, or be formed through a combination of the above two ways, so as to form a plurality of recessed lines 4 thereon. Using the above-mentioned processes, the recessed lines 4 formed on the masking layer 5 can have a precisely controlled width.

Step (D): form one or more metal conductive electrodes 6 in the recessed lines 4 on the masking layer 5. That is, the metal conductive electrodes 6 are restricted within the recessed lines 4. Therefore, it is able to ensure the width of the finally formed metal conductive electrodes 6. The metal conductive electrodes 6 can be formed through vacuum sputtering, vapor deposition, chemical deposition, electroplating, conductive polymer coating, or any combination thereof.

And, the metal conductive electrodes 6 can be formed of gold (Au), copper (Cu), silver (Ag), zinc (Zn), aluminum (Al), nickel (Ni), tin (Sn), or any alloy thereof; or can be formed of an electrically conductive polymeric material.

Step (E): Remove the masking layer 5 for the metal conductive electrodes 6 to present a circuit pattern on the adhesion layer 3; remove portions of the adhesion layer 3 that are located between the metal conductive electrodes 6 through an etching process; and form a weatherproof layer 7 on around peripheral surfaces 61 of each of the metal conductive electrodes 6 and outer surfaces of the adhesion layer 3, so that the weatherproof layer 7 seals and therefore isolates the metal conductive electrodes 6 from an outer space. The weatherproof layer 7 can be formed through chemical deposition, electroplating, conductive polymer coating, or any combination thereof, and can be formed of carbon (C), graphite, a metal material, a metal oxide material, an electrically conductive polymeric material, or any composite material thereof.

After the above steps (A), (B), (C), (D) and (E) are completed, a preliminary touch sensing electrode structure according to the present invention is formed, and every metal conductive electrode thereof has a width precisely controlled to a range between 0.1 μm and 10 μm.

The metal material for forming the weatherproof layer 7 can be tungsten (W), nickel (Ni), chromium (Cr), copper (Cu), aluminum (Al), silver (Ag), titanium (Ti), molybdenum (Mo), tin (Sn), zinc (Zn), cobalt (Co), iron (Fe), niobium (Nb), or any alloy thereof. The metal oxide material for forming the weatherproof layer 7 can be an oxide of tungsten, nickel, chromium, copper, aluminum, sliver, titanium, molybdenum, tin, zinc, cobalt, iron or niobium, or any alloy thereof.

Further, the weatherproof layer 7 can be configured to have a dark color to provide a blackening effect, so that it indirectly prevents the metal conductive electrodes 6 from being visually perceived by users. The weatherproof layer 7 in a dark color also effectively reduces the interference phenomenon of the moiré effect, making the touchscreen more comfortable for viewing.

Step (F): Deliver the preliminary touch sensing electrode structure to related destinations for other subsequent processes, and thereafter, coat or attach an optically clear adhesive (OCA) film 8 on or to the preliminary touch sensing electrode structure to completely cover and seal the metal conductive electrodes 6. The optically clear adhesive film 8 can be made of silicone or acrylic resin.

According to the present invention, the metal conductive electrodes 6 are completely enclosed in the optically clear adhesive film 8, and the optically clear adhesive film 8 forms an almost flat surface on the substrate layer 2 without leaving any clearance between the metal conductive electrodes 6 that present the circuit pattern.

The metal conductive electrodes 6 presenting the circuit pattern can be formed on only one side of the substrate layer 2 (not shown), or be formed on two opposite sides of the substrate layer 2. In other preferred embodiments of the present invention, the touch sensing electrodes 6 can be even formed on multiple sides of the substrate layer 2.

Figure 7A:
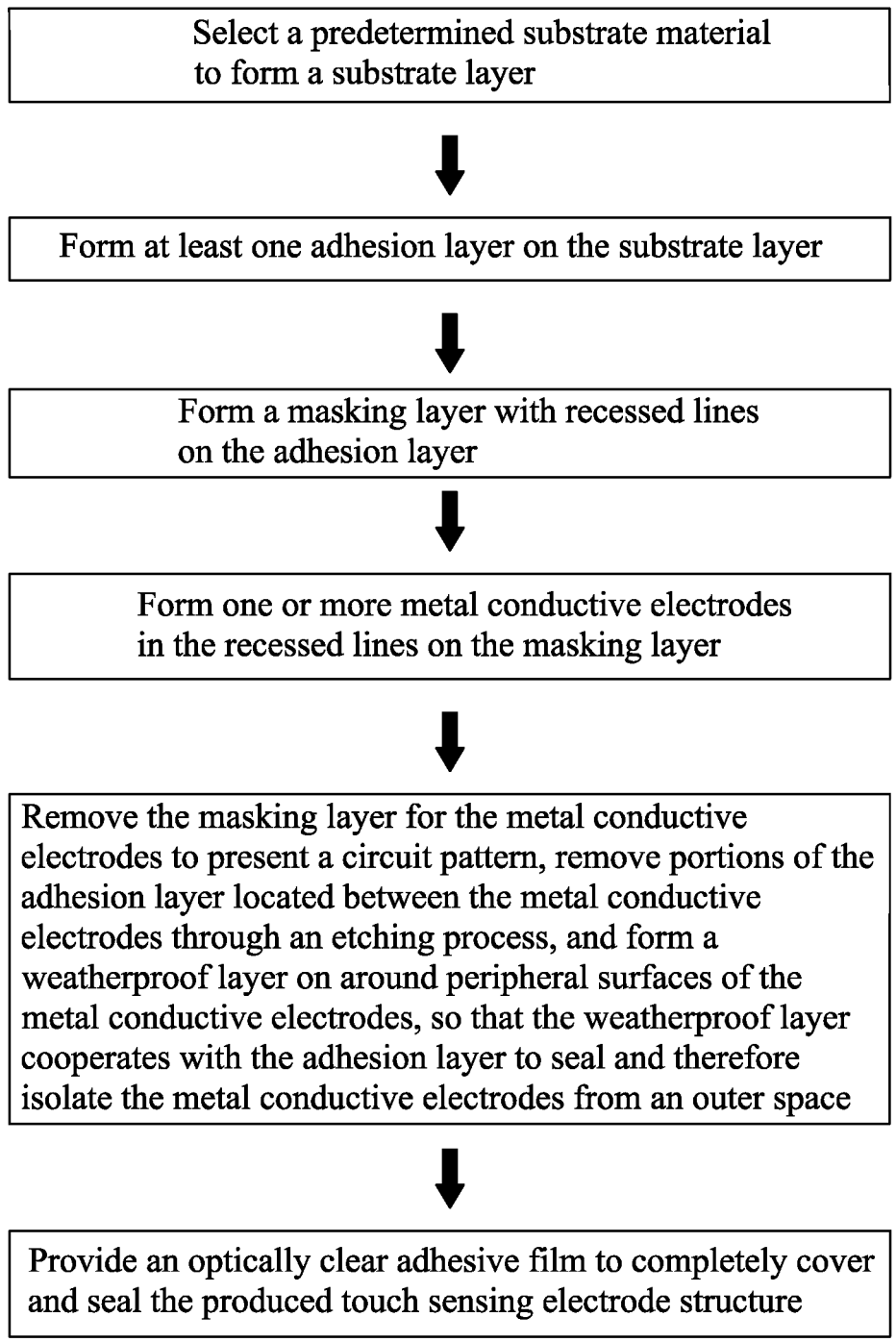
FIG. 7A is a flowchart showing the steps included in the method of manufacturing touch sensing electrode structure of the present invention according to a second preferred embodiment thereof.
Figure 7B:
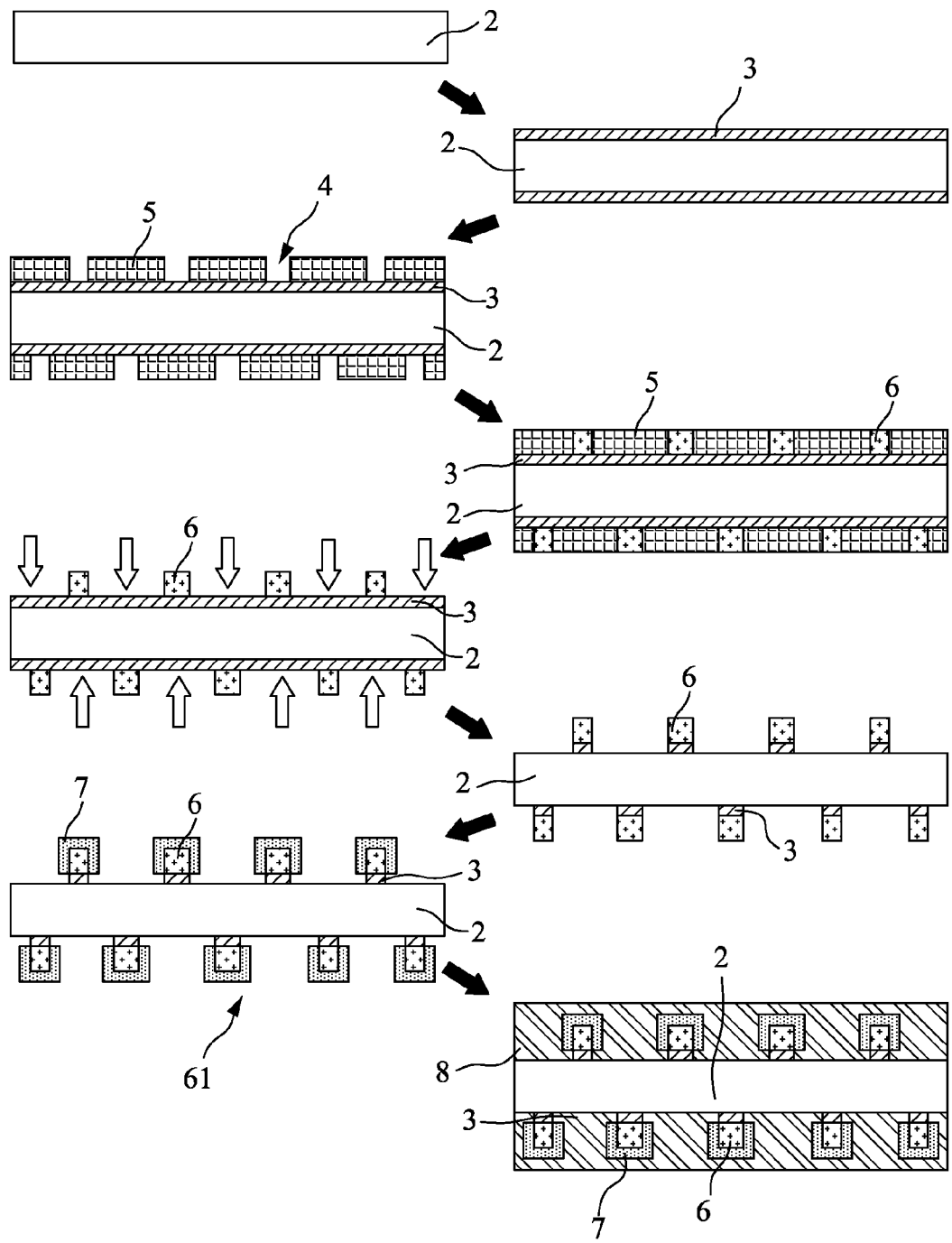
FIG. 7B is a pictorial description of the steps in the flowchart of FIG. 7A.

Please refer to FIG. 7A that is a flowchart showing the steps included in a second preferred embodiment of the method of manufacturing touch sensing electrode structure according to the present invention, and to FIG. 7B that is a pictorial description of the steps in the flowchart of FIG. 7A. The second preferred embodiment includes step (A), (B), (C) and (D) that are the same as those in the first preferred embodiment, but includes step (E) and (F) different from those in the first preferred embodiment. The following is a detailed description of the steps (E) and (F) in the second preferred embodiment of the method of the present invention. Step (E): Remove the masking layer 5 for the metal conductive electrodes 6 to present a circuit pattern on the adhesion layer 3; remove portions of the adhesion layer 3 that are located between the metal conductive electrodes 6 through an etching process; and form a weatherproof layer 7 around peripheral surfaces 61 of each of the metal conductive electrodes 6.

Step (F): Provide an optically clear adhesive film 8 to completely cover and seal the substrate layer 2, the adhesion layer 3 and the weatherproof layer 7.

More specifically, the weatherproof layer 7 can include a first weatherproof layer 70 formed on a top surface 60 of each of the metal conductive electrodes 6 that present the circuit pattern, and a second weatherproof layer 71 formed on around the peripheral surfaces 61 of each of the metal conductive electrodes 6 that present the circuit pattern, as will be described in the following third and fourth preferred embodiments of the method of the present invention.

Figure 8B:
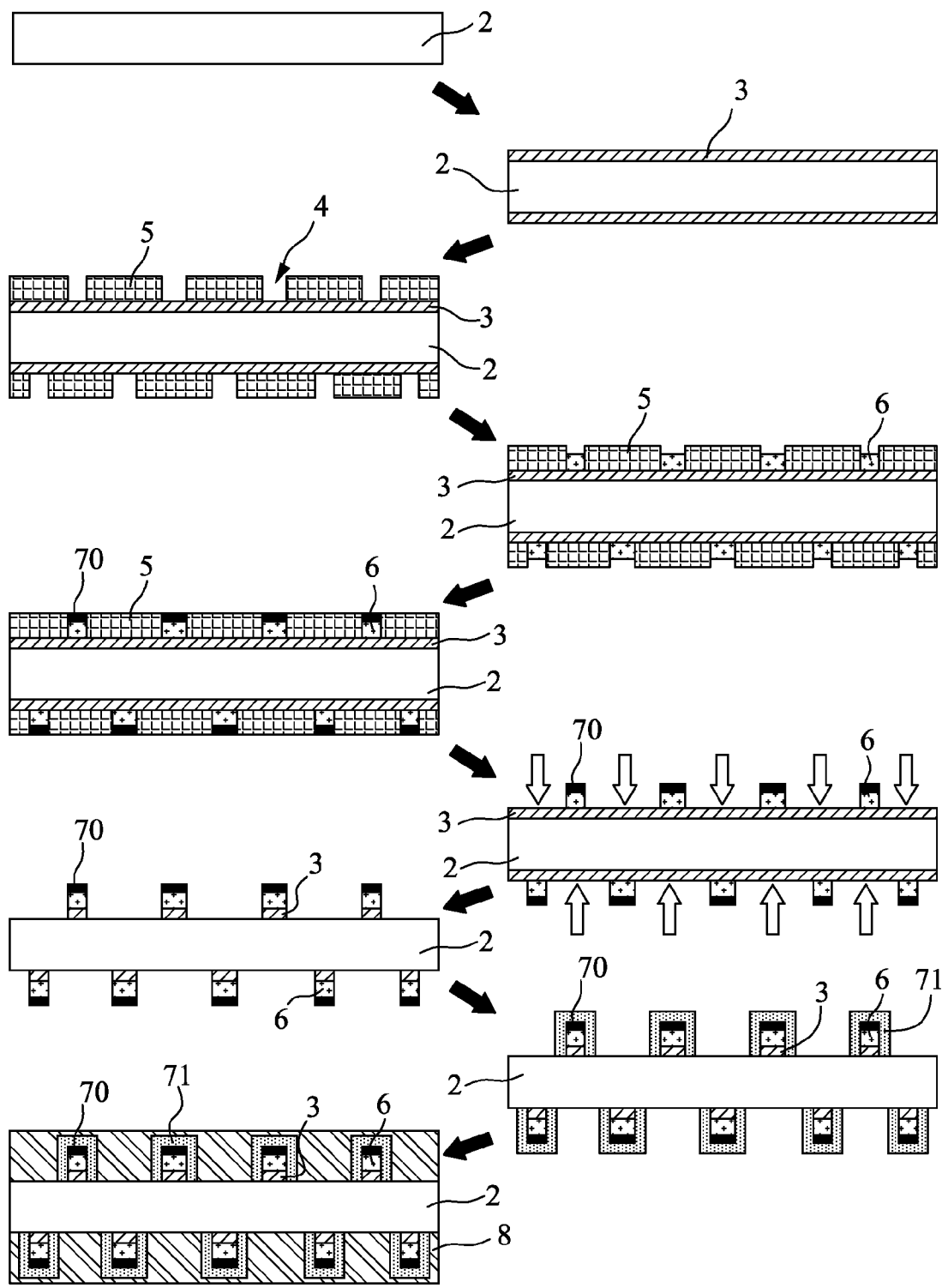
FIG. 8B is a pictorial description of the steps in the flowchart of FIG. 8A.

FIG. 8A is a flowchart showing the steps included in the third preferred embodiment of the method of manufacturing touch sensing electrode structure according to the present invention, and FIG. 8B is a pictorial description of the steps in the flowchart of FIG. 8A. The third preferred embodiment includes step (A) to (F), wherein the step (A), (B), (C) and (F) are the same as those in the first preferred embodiment while the step (D) and (E) are different from those in the first preferred embodiment. The following is a detailed description of the steps (D) and (E) in the third preferred embodiment of the method of the present invention. Step (D): form one or more metal conductive electrodes 6 in the recessed lines 4 on the masking layer 5, and then, form a first weatherproof layer 70 on a top surface 60 of each of the metal conductive electrodes 6.

Step (E): Remove the masking layer 5 for the metal conductive electrodes 6 to present a circuit pattern on the adhesion layer 3; remove portions of the adhesion layer 3 that are located between the metal conductive electrodes 6 through an etching process; and form a second weatherproof layer 71 around peripheral surfaces 61 of each of the metal conductive electrodes 6, outer surfaces of each of the first weatherproof layer 70, and outer surfaces of the adhesion layer 3, so that the second weatherproof layer 71 and the adhesion layer 3 together seal and therefore isolate the metal conductive electrodes 6 from an outer space.

Figure 9A:
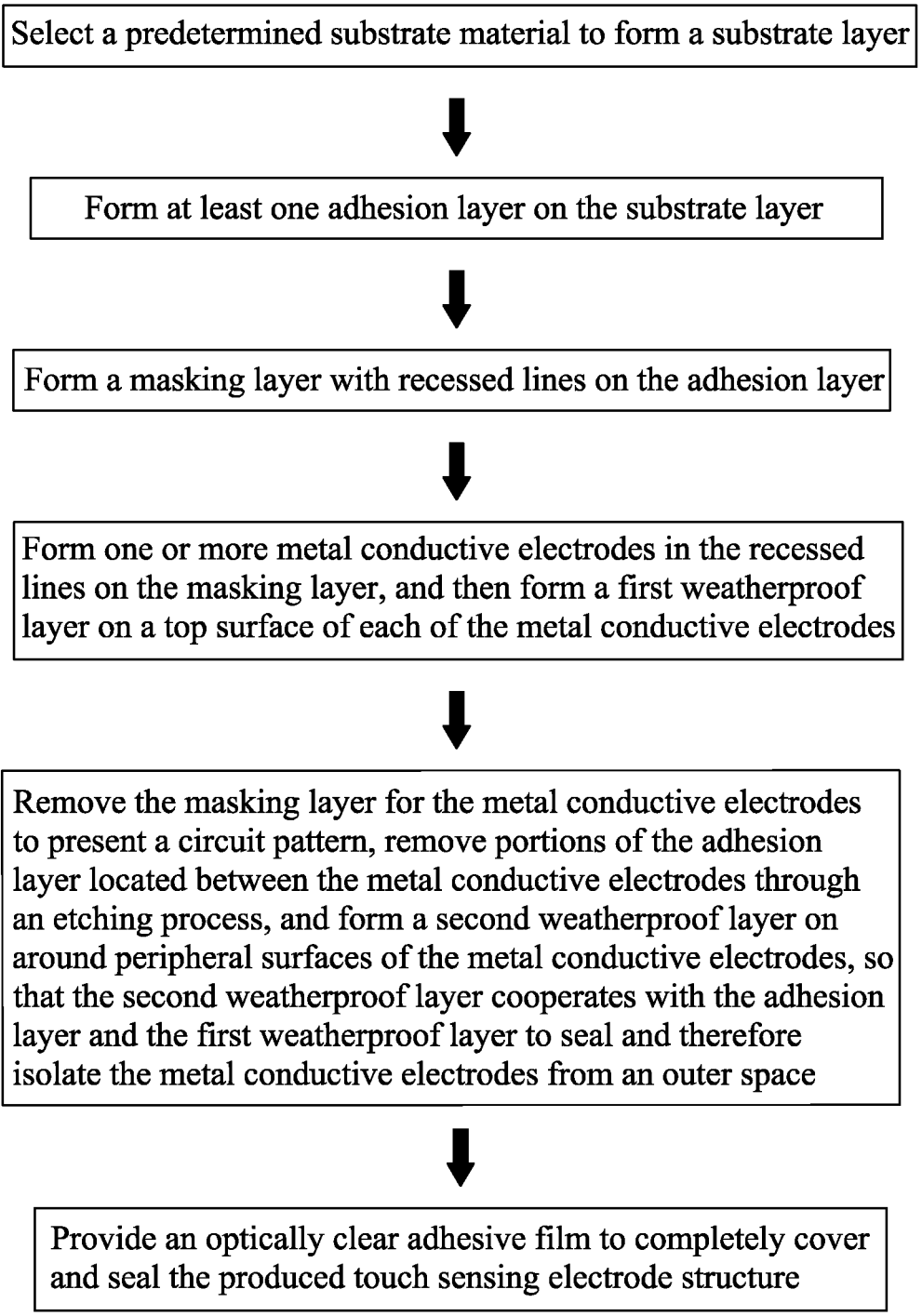
FIG. 9A is a flowchart showing the steps included in the method of manufacturing touch sensing electrode structure of the present invention according to a fourth preferred embodiment thereof.
Figure 9B:
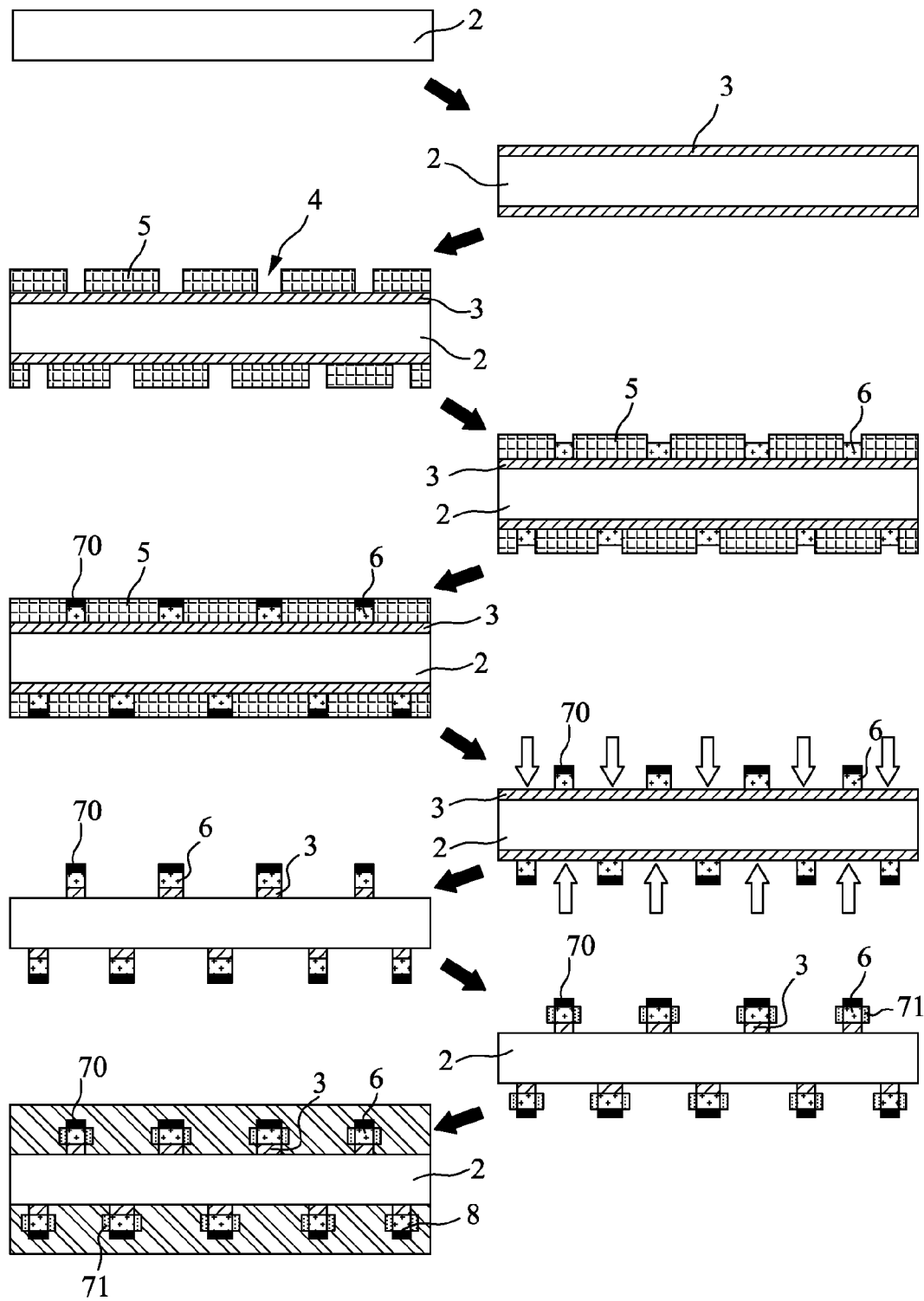
FIG. 9B is a pictorial description of the steps in the flowchart of FIG. 9A.

FIG. 9A is a flowchart showing the steps included in the fourth preferred embodiment of the method of manufacturing touch sensing electrode structure according to the present invention, and FIG. 9B is a pictorial description of the steps in the flowchart of FIG. 9A. The fourth preferred embodiment includes step (A) to (F), wherein the step (A), (B), (C) and (D) are the same as those in the third preferred embodiment while the step (E) and (F) are different from those in the third preferred embodiment. The following is a detailed description of the steps (E) and (F) in the fourth preferred embodiment of the method of the present invention. Step (E): Remove the masking layer 5 for the metal conductive electrodes 6 to present a circuit pattern on the adhesion layer 3; remove portions of the adhesion layer 3 that are located between the metal conductive electrodes 6 through an etching process; and form a second weatherproof layer 71 on around peripheral surfaces 61 of each of the metal conductive electrodes 6, so that the second weatherproof layer 71 cooperates with the adhesion layer 3 and the first weatherproof layer 70 to seal and therefore isolate the metal conductive electrodes 6 from an outer space.

Step (F): Provide an optically clear adhesive film 8 to completely cover and seal the substrate layer 2, outer surfaces of the adhesion layer 3, peripheral surfaces of the first weatherproof layer 70, and peripheral surfaces of the second weatherproof layer 71.

In this manner, the peripheral surfaces 61 of the metal conductive electrodes 6 are completely covered by the weatherproof layer 7 to thereby enable prolonged service life of the touch sensing electrode structure manufactured according to the method of the present invention.

Further, in the manufacturing method of the present invention, by using the masking layer 5 with predetermined circuit pattern to form the metal conductive electrodes 6, it is able to overcome the problems of low yield rate and non-uniform electrode widths due to serious side etching as found in the conventional method of manufacturing metal conductive electrodes. In other words, the touch sensing electrode structure manufacturing method of the present invention achieves two important objects, namely, increasing the yield rate of the metal conductive electrodes 6 and enabling precisely controlled width of the metal conductive electrodes 6.

Figure 10B:
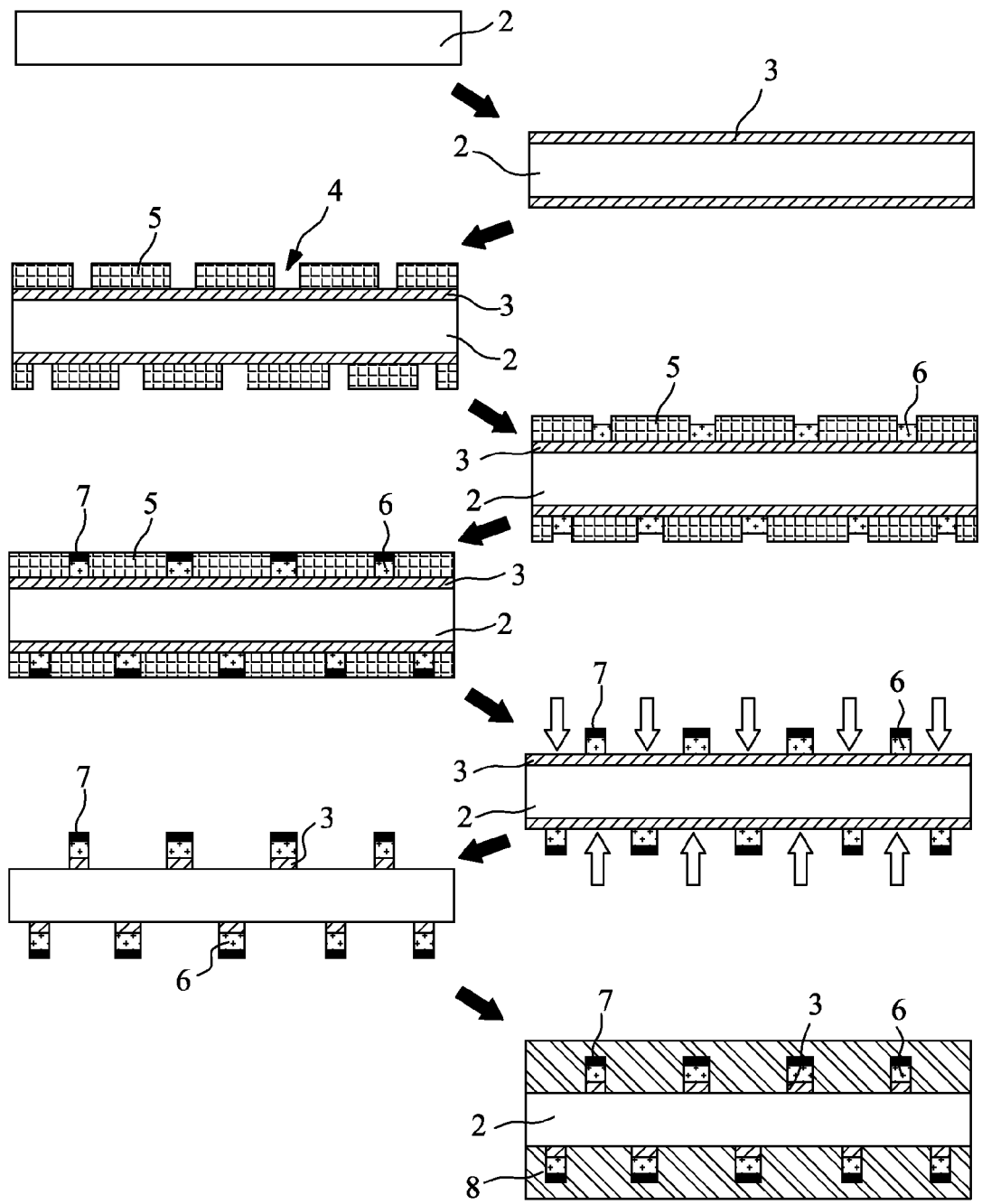
FIG. 10B is a pictorial description of the steps in the flowchart of FIG. 10A.

FIG. 10A is a flowchart showing the steps included in a fifth preferred embodiment of the method of manufacturing touch sensing electrode structure according to the present invention, and FIG. 10B is a pictorial description of the steps in the flowchart of FIG. 10A. The fifth preferred embodiment includes step (A) to (F), wherein the step (A), (B), (C) and (D) are the same as those in the fourth preferred embodiment while the step (E) and (F) are different from those in the fourth preferred embodiment. The following is a detailed description of the steps (E) and (F) in the fifth preferred embodiment of the method of the present invention. Step (E): Remove the masking layer 5 for the metal conductive electrodes 6 to present a circuit pattern on the adhesion layer 3, and remove portions of the adhesion layer 3 that are located between the metal conductive electrodes 6 through an etching process.

Step (F): Provide an optically clear adhesive film 8 to completely cover and seal the substrate layer 2, outer surfaces of the remained adhesion layer 3, peripheral surfaces 61 of each of the metal conductive electrodes 6, and outer surfaces of the weatherproof layer 7.

Figure 11:
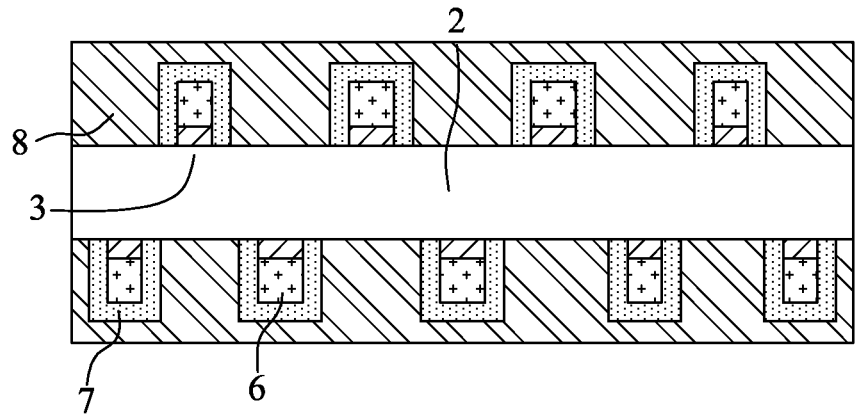
FIG. 11 is a sectional side view of a touch sensing electrode structure of the present invention according to a first preferred embodiment thereof.
Figure 12:
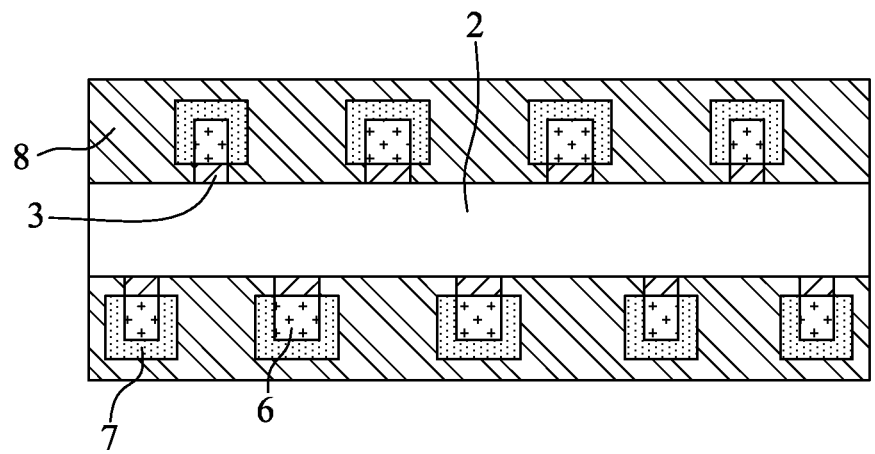
FIG. 12 is a sectional side view of the touch sensing electrode structure of the present invention according to a second preferred embodiment thereof.
Figure 13:
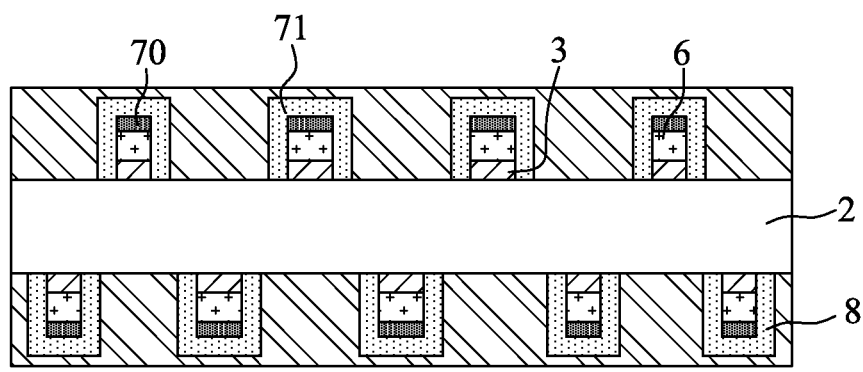
FIG. 13 is a sectional side view of the touch sensing electrode structure of the present invention according to a third preferred embodiment thereof.

FIGS. 11, 12 and 13 show some preferred embodiments of a touch sensing electrode structure according to the present invention. The touch sensing electrode structure includes a substrate layer 2, at least one adhesion layer 3, one or more metal conductive electrodes 6, and at least one weatherproof layer 7. The substrate layer 2 can be formed of a glass sheet, a plastic sheet, or a plastic film. The touch sensing electrodes 6 can be formed on only one side or on two opposite sides of the substrate layer 2.

According to the present invention, the substrate layer 2 is made of a predetermined substrate material; the at least one adhesion layer 3 is electrically conductive and formed on the substrate layer 2 to provide a circuit pattern; and the metal conductive electrodes 6 are connected to the substrate layer 2 via the adhesion layer 3.

In practical implementation of the present invention, every metal conductive electrode 6 has a width ranged between 0.1 μm and 10 μm. When viewing from a top of the touch sensing electrode structure of the present invention, the metal conductive electrodes 6 are located corresponding to the circuit pattern to form a conducting circuit having a grid-like structure. And, as can be seen from the sectional side views of the touch sensing electrode structure shown in FIGS. 11 to 13, the weatherproof layer 7 is formed on around peripheral surfaces 61 of every metal conductive electrode 6 to have an n-shaped sectional structure, and an optically clear adhesive film 8 is coated on or attached to outer surfaces of the substrate layer 2 and the weatherproof layer 7.

FIG. 11 is a sectional side view of a first preferred embodiment of the touch sensing electrode structure according to the present invention. In this first preferred embodiment, the weatherproof layer 7 is formed on around not only the peripheral surfaces 61 of every metal conductive electrode 6, but also the outer surfaces of the adhesion layer 3 to have an n-shaped sectional structure. Further, the weatherproof layer 7 is configured to have a relatively dark color to provide not only protecting and shielding effects, but also a blackening effect.

FIG. 12 is a sectional side view of a second preferred embodiment of the touch sensing electrode structure according to the present invention. In this second preferred embodiment, the weatherproof layer 7 is formed on around only the peripheral surfaces 61 of every metal conductive electrode 6 to have an n-shaped sectional structure.

FIG. 13 is a sectional side view of a third preferred embodiment of the touch sensing electrode structure according to the present invention. In this third preferred embodiment, a first weatherproof layer 70 is first formed on only a top surface 60 of every metal conductive electrode 6, and then a second weatherproof layer 71 is further formed not only on around the peripheral surfaces 61 of every metal conductive electrode 6, but also on around outer surfaces of the adhesion layer 3. Therefore, the first and the second weatherproof layer 70, 71 cooperate with the adhesion layer 3 to seal and isolate all the metal conductive electrodes 6 from an outer space. And, the first and second weatherproof layers 70, 71 together present an n-shaped sectional structure when viewing from a lateral side of the touch sensing electrode structure.

In a fourth preferred embodiment of the touch sensing electrode structure according to the present invention, which is not shown herein, a first weatherproof layer 70 is first formed on only a top surface 60 of every metal conductive electrode 6, and then a second weatherproof layer 71 is further formed on around only peripheral surfaces of every metal conductive electrode 6. Again, the first and second weatherproof layers 70, 71 together present an n-shaped sectional structure when viewing from a lateral side of the touch sensing electrode structure.

According to the touch sensing electrode structure of the present invention, the adhesion layer 3 has a thickness ranged between 0.01 μm and 1 μm; every metal conductive electrode 6 has a thickness ranged between 0.1 μm and 6 μm; and the weatherproof layer 7 has a thickness ranged between 0.01 μm and 1 μm.

Compared to the conventional metal conductive electrodes 10 shown in FIG. 1, the metal conductive electrodes 6 in all the four preferred embodiments of the touch sensing electrode structure of the present invention are covered by the weatherproof layer 7 or the first and second weatherproof layers 70, 71. With this arrangement, the touch sensing electrode structure according to the present invention not only has very good environmental and weather durability in high-temperature, high-humidity or low-temperature environment, but also has high yield rate. Further, with the metal conductive electrodes 6 having uniform small width, the touch sensing electrode structure of the present invention can have stable capacitive sensitivity.

Moreover, being completely covered and sealed by the optically clear adhesive film 8, the touch sensing electrode structure of the present invention is protected against oxidation due to moisture in the air even if it has been used over a long time. That is, the touch sensing electrode structure of the present invention has enhanced anti-oxidation ability to have prolonged service life.

Further, in the touch sensing electrode structure of the present invention, since the weatherproof layer 7 formed on around the metal conductive electrodes 6 can be configured to have a relative dark color to provide the blackening effect and the adhesion layer 3 can further include a blackened layer 30 formed on the substrate layer 2, positions having the weatherproof layer 7 formed on a first side of the substrate layer 2 and positions having the blackened layer 30 formed on an opposite second side of the substrate layer 2 are arranged in a staggered relation, so that a user using the touchscreen first sees the weatherproof layer 7 on the first side of the substrate layer 2, and then sees the blackened layer 30 on the second side of the substrate layer 2 when light passes through gaps between the positions having the weatherproof layer 7 into the substrate layer 2 to reach at the second side of the substrate layer 2. Unlike a touchscreen with the conventional metal conductive electrodes 10, with which a user will directly perceive the metal conductive electrodes 10 formed on the second side of the substrate 12 via the gaps between the metal conductive electrodes 10 formed on the first side of the substrate 12, the touch sensing electrode structure of the present invention provides a complete shielding effect so that a user will not visually perceive the metal conductive electrodes 6 formed on the second side of the substrate layer 2. Therefore, the touch sensing electrode structure of the present invention effectively reduces the moiré effect and avoids the metal conductive electrodes 6 on the second side thereof from being visually perceived by the user.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A method of manufacturing touch sensing electrode structure, comprising the steps of:
   (A) selecting a predetermined substrate material to form a substrate layer;
   (B) forming at least one adhesion layer on the substrate layer;
   (C) forming a masking layer with recessed lines on the adhesion layer;
   (D) forming one or more metal conductive electrodes in the recessed lines on the masking layer; and
   (E) removing the masking layer for the metal conductive electrodes to present a circuit pattern on the adhesion layer, removing portions of the adhesion layer that are located between the metal conductive electrodes through an etching process, and forming at least one weatherproof layer on the metal conductive electrodes.

2. The method of manufacturing touch sensing electrode structure as claimed in claim 1, wherein, in the step (E), the weatherproof layer is formed on around peripheral surfaces of each of the metal conductive electrodes, and the weatherproof layer cooperates with the adhesion layer to seal and isolate the metal conductive electrodes from an outer space.

3. The method of manufacturing touch sensing electrode structure as claimed in claim 2, wherein the weatherproof layer is configured to have a blackening effect to shield the metal conductive electrodes from being visually perceived by a user.

4. The method of manufacturing touch sensing electrode structure as claimed in claim 1, wherein the step (D) further includes a step of forming a first weatherproof layer on a top surface of each of the metal conductive electrodes.

5. The method of manufacturing touch sensing electrode structure as claimed in claim 1, wherein, in the step (E), the at least one weatherproof layer includes a second weatherproof layer formed on peripheral surfaces of each of the metal conductive electrodes.

6. The method of manufacturing touch sensing electrode structure as claimed in claim 1, wherein, in the step (B), the adhesion layer includes an intermediate layer formed on the substrate layer, an electrically conductive seed layer formed on the intermediate layer, and an anti-oxidation layer formed on the seed layer.

7. The method of manufacturing touch sensing electrode structure as claimed in claim 1, wherein, in the step (B), the adhesion layer includes a blackened layer formed on the substrate layer, an intermediate layer formed on the blackened layer, and an electrically conductive seed layer formed on the intermediate layer.

8. The method of manufacturing touch sensing electrode structure as claimed in claim 1, wherein, in the step (B), the adhesion layer includes a blackened layer formed on the substrate layer, an intermediate layer formed on the blackened layer, an electrically conductive seed layer formed on the intermediate layer, and an anti-oxidation layer formed on the seed layer.

9. The method of manufacturing touch sensing electrode structure as claimed in claim 1, wherein, in the step (C), the masking layer is formed on the adhesion layer through a process selected from the group consisting of a printing process, a photoresist exposure and development process, and any combination thereof.

10. A touch sensing electrode structure, comprising:
a substrate layer;
at least one adhesion layer forming a circuit pattern on the substrate layer;
one or more metal conductive electrodes formed on the adhesion layer to provide a conducting circuit corresponding to the circuit pattern; and
a weatherproof layer connected to and covering peripheral surfaces of each of the metal conductive electrodes, so as to seal and isolate the conducting circuit from an outer space.

11. The touch sensing electrode structure as claimed in claim 10, wherein the weatherproof layer includes a first weatherproof layer formed on a top surface of each of the metal conductive electrodes corresponding to the circuit pattern and a second weatherproof layer formed on peripheral surfaces of each of the metal conductive electrodes and outer surfaces of the adhesion layer corresponding to the circuit pattern.

12. The touch sensing electrode structure as claimed in claim 10, wherein the adhesion layer includes an intermediate layer formed on the substrate layer, an electrically conductive seed layer formed on the intermediate layer, and an anti-oxidation layer formed on the seed layer.

13. The touch sensing electrode structure as claimed in claim 10, wherein the adhesion layer includes a blackened layer formed on the substrate layer, an intermediate layer formed on the blackened layer, and an electrically conductive seed layer formed on the intermediate layer.

14. The touch sensing electrode structure as claimed in claim 10, wherein the adhesion layer includes a blackened layer formed on the substrate layer, an intermediate layer formed on the blackened layer, an electrically conductive seed layer formed on the intermediate layer, and an anti-oxidation layer formed on the seed layer.

15. The touch sensing electrode structure as claimed in claim 10, wherein the conducting circuit formed of the metal conductive electrodes presents a grid-like structure; and the weatherproof layer presents an n-shaped sectional structure.

16. The touch sensing electrode structure as claimed in claim 10, wherein the substrate layer is formed of a material selected from the group consisting of a soft material and a glass sheet material; and the soft material being selected from the group consisting of polyethylene terephthalate (PET), poly(methyl methacrylate) (PMMA), polycarbonate (PC), poly(phenylene sulfone) (PPSU), polyethylenimine (PEI) and polyimide (PI).

17. The touch sensing electrode structure as claimed in claim 10, wherein the adhesion layer is formed of a material selected from the group consisting of a metal material, a metal oxide material, a polymeric material, and any composite material thereof.

18. The touch sensing electrode structure as claimed in claim 17, wherein the metal material for forming the adhesion layer is selected from the group consisting of tungsten (W), nickel (Ni), chromium (Cr), copper (Cu), vanadium (V), molybdenum (Mo), tin (Sn), zinc (Zn), cobalt (Co), iron (Fe), titanium (Ti), aluminum (Al), niobium (Nb), and any alloy thereof; and wherein the metal oxide material for forming the adhesion layer is selected from the group consisting of an oxide of tungsten, nickel, chromium, copper, vanadium, molybdenum, tin, zinc, cobalt, iron, titanium, aluminum, niobium, and any alloy thereof.

19. The touch sensing electrode structure as claimed in claim 10, wherein the weatherproof layer is formed of a material selected from the group consisting of carbon (C), graphite, a metal material, a metal oxide material, an electrically conductive polymeric material, and any composite material thereof.

20. The touch sensing electrode structure as claimed in claim 19, wherein the metal material for forming the weatherproof layer is selected from the group consisting of tungsten (W), nickel (Ni), chromium (Cr), copper (Cu), aluminum (Al), silver (Ag), titanium (Ti), molybdenum (Mo), tin (Sn), zinc (Zn), cobalt (Co), iron (Fe), niobium (Nb), and any alloy thereof; and wherein the metal oxide material for forming the weatherproof layer is selected from the group consisting of an oxide of tungsten, nickel, chromium, copper, aluminum, sliver, titanium, molybdenum, tin, zinc, cobalt, iron, niobium, and any alloy thereof.

21. The touch sensing electrode structure as claimed in claim 10, wherein the adhesion layer has a thickness ranged between 0.01 μm and 1 μm; the metal conductive electrodes respectively have a thickness ranged between 0.1 μm and 6 μm; and the weatherproof layer has a thickness ranged between 0.01 μm and 1 μm.

22. The touch sensing electrode structure as claimed in claim 10, wherein the metal conductive electrodes respectively have a width ranged between 0.1 μm and 10 μm.

* * * * *